United States Patent
Gaul

(10) Patent No.: US 7,461,366 B2
(45) Date of Patent: Dec. 2, 2008

(54) USAGE OF A BUILDCODE TO SPECIFY LAYOUT CHARACTERISTICS

(75) Inventor: Stephen J. Gaul, Melbourne Village, FL (US)

(73) Assignee: Intersil Americas Inc., Milpitas, CA (US)

( * ) Notice: Subject to any disclaimer, the term of this patent is extended or adjusted under 35 U.S.C. 154(b) by 72 days.

(21) Appl. No.: 11/284,149

(22) Filed: Nov. 21, 2005

(65) Prior Publication Data

US 2007/0118825 A1 May 24, 2007

(51) Int. Cl.
*G06F 17/50* (2006.01)

(52) U.S. Cl. .............................. 716/17; 716/1; 716/11; 716/16

(58) Field of Classification Search .................. 716/11, 716/10, 1, 16, 17
See application file for complete search history.

(56) References Cited

U.S. PATENT DOCUMENTS

| | | | |
|---|---|---|---|
| 5,097,422 A * | 3/1992 | Corbin et al. .................. 716/8 |
| 5,920,486 A * | 7/1999 | Beahm et al. .................. 716/10 |
| 6,775,808 B1 * | 8/2004 | Raje et al. ....................... 716/4 |
| 6,804,809 B1 * | 10/2004 | West et al. ..................... 716/11 |
| 7,134,099 B2 * | 11/2006 | Collins et al. ................... 716/1 |
| 2002/0006695 A1 * | 1/2002 | Hatsch et al. ................ 438/200 |
| 2005/0216873 A1 * | 9/2005 | Singh et al. ..................... 716/5 |
| 2005/0229142 A1 * | 10/2005 | Boppana et al. ............... 716/17 |
| 2006/0053398 A1 * | 3/2006 | Cox et al. ...................... 716/11 |
| 2006/0253827 A1 * | 11/2006 | Karniewicz ................... 716/17 |
| 2006/0288315 A1 * | 12/2006 | Perez et al. ..................... 716/3 |
| 2007/0094628 A1 * | 4/2007 | Dao ............................ 716/11 |

* cited by examiner

*Primary Examiner*—Jack Chiang
*Assistant Examiner*—Suchin Parihar
(74) *Attorney, Agent, or Firm*—Fogg & Powers LLC

(57) ABSTRACT

A method for laying out custom integrated circuits includes the steps of preliminarily laying out a custom integrated circuit using a plurality of libraried standardized programmed cells (p-cells). Buildcode representations are then assigned for each of a plurality of circuit components and features thereof to realize customization of at least a portion of the plurality of p-cells. A final layout of the custom integrated circuit is then generated using the buildcode representations.

20 Claims, 5 Drawing Sheets

BUILD CODE = SGD    BUILD CODE = SG(U1.0 L1.0)D

STEP 510

A preliminary integrated circuit layout is performed using a plurality of stored standardized programmed cells (p-cells).

STEP 520

A plurality of representations each comprising at least one variable are assigned. The representations each represent a plurality of circuit components or features thereof. The representations have associated instructions for building or customizing a portion of the p-cells.

STEP 530

More than one of the plurality of representations are selected to form a buildcode string, the buildcode string comprising a plurality of the variables.

STEP 540

A final layout of the custom integrated circuit is generated using at least one buildcode string.

FIG. 5

USAGE OF A BUILDCODE TO SPECIFY LAYOUT CHARACTERISTICS

CROSS-REFERENCE TO RELATED APPLICATIONS

Not applicable.

STATEMENT REGARDING FEDERALLY SPONSORED RESEARCH OR DEVELOPMENT

Not applicable.

FIELD OF THE INVENTION

The present invention relates to computer-aided-design (CAD) software for integrated circuits. More specifically, the invention relates to "programmed cells" or "p-cells" used to represent the mask layout representations used during the mask layout task for implementing integrated circuits.

DESCRIPTION OF THE RELATED ART

Integrated circuit development uses software to transition from a circuit schematic to a layout. For example, Cadence software (DFII, Cadence Inc., San Jose, Calif.) is commonly used to enable schematic capture, schematic simulation (using a simulation engine), layout capture (either manual or semi-automated), and layout verification including design-rule-checking and layout vs. schematic checking (DRC & LVS, respectively). Tape-out or stream out to a data file format usable by the mask making vendor then generally occurs. The masks received from the mask vendor are then used during the integrated circuit manufacturing process to fabricate the actual integrated circuit.

Circuit design software is generally based on p-cells which utilize parameters for circuit elements determined during circuit simulation to produce the layout representation of that element. P-cells generally include both passive component arrays (e.g. capacitor p-cell) and active component arrays (e.g. an NMOS or PMOS p-cell), as well as parameterized subcircuits. For example, a NMOS p-cell uses gate length, gate width, multiplicity and/or number of gate stripes or fingers, etc., to describe its electrical "size", as well as the actual mask layout size. It is common practice to add other parameters that describe extra features that are only present in the layout view of the element. These parameters may include gate contacts as these are assumed in the "circuit" element, but not always part of the layout view. FIG. 1(a), (b) and (c) show a MOS layout, a MOS layout with gate contact, and a circuit element (gate contact is assumed), respectively.

Another layout parameter that may not be specified at the time of circuit simulation is the presence and or location of body ties. There are also layout parameters that may specify stretches to gate poly, diffusions, etc. that are used for "fitting" purposes.

An example of a fitting parameter is the trench stretch used in a high voltage process which utilizes trench isolation. Since there are ground rules for minimum trench to trench spacing, it is sometimes necessary to stretch one or more of the trenches to eliminate design rule checking (DRC) errors.

In the Example shown in FIGS. 2(a) and (b), a trench stretch parameter is used as a bipolar junction transistor (BJT) fitting parameter. The conventional p-cell shown in FIG. 2(a) has a DRC error that would need 4 trench stretch parameters in order to adjust or fit all circumstances. Specifically, the 4 trench stretch parameters include a stretch parameter for each side of the trench isolation (trench stretch top, trench stretch bottom, trench stretch left, and trench stretch right). FIG. 2(b) shows one side of one of the BJTs stretched to eliminate the DRC error. Likewise, a MOS transistor would need a parameter describing the placement of a gate contact, but may need more than one such parameter if flexibility in the need for a gate contact on every gate stripe is desired as described below. Typically, a MOS transistor p-cell includes a single parameter to provide a gate contact, but such a parameter specifies a gate contact for every gate stripe or finger if there are multiple stripes or fingers. If flexibility is needed where only one or several of many gate fingers need gate contacts, a gate contact parameter for each gate stripe or finger needs to be provided. A ten finger MOS element would then need ten gate contact parameters in order to individually control the gate contact presence or position on each gate finger. Accordingly, conventional layout software layout customizations generally require a large number of added parameters, which can become impractical or burdensome to support in the CAD software.

SUMMARY

A method for laying out custom integrated circuits comprising the steps of preliminarily laying out a custom integrated circuit using a plurality of libraried standardized programmed cells (p-cells), assigning buildcode representations for each of a plurality of circuit components and features thereof to realize customization of at least a portion of the plurality of p-cells, and generating a final layout of the custom integrated circuit using the buildcode representations. The buildcode representations can comprise alpha-numeric strings.

The buildcode representations can include coding for customizing at least one semiconductor device connection. The semiconductor device connections can specify layout information for sources, drains, gates, emitters, bases, collectors, cathodes, anodes, plus and minus terminals, body ties, well ties, substrates ties or tub ties. The buildcode representations can also include coding for a fitting parameter. In another embodiment, the buildcode representations include coding which adds a multiplier for at least one geometrical feature. The geometrical feature can specify information regarding contact width or a number of gate contacts.

The semiconductor device can be described using several buildcodes, such as a first and a second buildcode. In this embodiment, the first buildcode can specify an internal arrangement of device connections such as to sources, drains, gates, emitters, bases, collectors, cathodes, anodes, plus and minus terminals and body ties, while the second buildcode can specify guardband or isolation layout options, as well as a number or location of well ties, substrates ties or tub ties.

The buildcode can also include a multiplier to represent repeating strings otherwise appearing in the buildcode to reduce a number of characters in the buildcode in another embodiment, the buildcode includes a representation to support sharing of at least one device region between neighboring devices.

The method can further comprise the step of fabricating a plurality of mask sets based on the final layout. The method can further comprise the step fabricating an integrated circuit using the plurality of mask sets generated from layouts using buildcodes according to the invention.

A machine readable storage has stored thereon a computer program having a plurality of code sections executable by a machine for causing the machine to perform the step of generating a final layout of a custom integrated circuit using a plurality of buildcode representations. The buildcode representations customize at least a portion of the p-cells which are used in a preliminarily layout of the custom integrated circuit.

BRIEF DESCRIPTION OF DRAWINGS

The invention will be described in detail in the following description of preferred embodiments with reference to the following figures wherein:

FIG. 2(a) shows a conventional p-cell for a trench isolation comprising process having a DRC error between two (2) adjacent BJTs which using conventional design approaches would need 4 trench stretch parameters in order to adjust or fit for all circumstances, while FIG. 2(b) shows one side of one of the BJT transistors stretched to eliminate the DRC error shown in FIG. 2(a).

FIG. 3(a) shows a MOS layout having a double source/drain contact in a standard width source and drain, while FIG. 3(b) shows a MOS layout having a double source/drain contact disposed in a source and drain having a double width which is implemented using a single buildcode according to the invention.

FIG. 5 is a flow chart showing steps in an exemplary method for layout of custom integrated circuits generated using at least one buildcode string, according to the invention.

DETAILED DESCRIPTION OF PREFERRED EMBODIMENTS

Figure 1A:
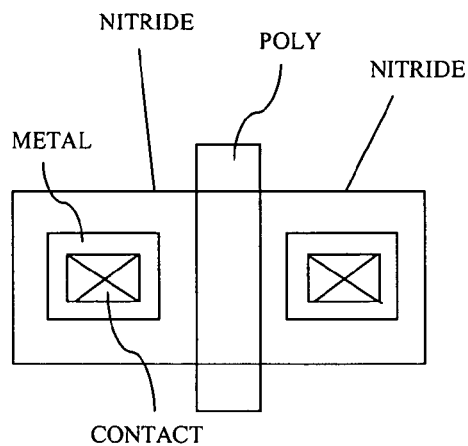
FIGS. 1(a), (b) and (c) show a MOS layout, a MOS layout with gate contact, and a circuit element (gate contact is assumed), respectively.

A method for laying out custom integrated circuits comprises the steps of preliminarily laying out a custom integrated circuit using a plurality of libraried standardized programmed cells (p-cells). Buildcode representations are then assigned for each of a plurality of circuit components and features thereof to realize customization of at least a portion of the plurality of p-cells. A final layout of the custom integrated circuit is then generated using the buildcode representations. As described below, buildcode based layouts according to the invention allows simplified customization of mask layout views or p-cells used during integrated circuit layout. Integrated circuit are then fabricated using a plurality of mask sets which are generated from the buildcode derived final layout.

The system of the present invention includes a circuit design program preferably written in SKILL™ (a trademark of Cadence, Inc.) and runs in the Cadence Design System, available from Cadence, Inc. The present invention may be programmed in other programming languages as well.

For the purposes of the present application, references and examples are made with respect to the Cadence Software, but the invention is not specifically tied to the Cadence Software and is applicable to the design flow described above and is general enough to be applied to CAD or CAE Software provided by other design software vendors. Moreover, although the invention is generally described relative to analog MOS comprising integrated circuits, the invention is in no way limited to either analog or MOS. For example, the invention can be used for digital designs, bipolar designs, as well as bi-MOS designs.

The invention uses a buildcode parameter rather than the conventional approach which relies on addition of a large number of parameters to a layout p-cell to change its appearance. The buildcode can be an alpha-numeric string variable (e.g. SGDGS for a two gate MOS device based on the exemplary code described below), but can also take the form of other variable types including lists and data structures, or other variable types that can provide instructions for building or customizing a particular p-cell. For the present embodiment, a simple alpha-numeric code is preferably used as it is easy to remember and easy to implement as a simple "string" type variable. The buildcode thus represents "microcoding" of the p-cell in that it can accommodate many different parametric changes while being represented by a single parameter, or at most only a few parameters (e.g. 2 or 3). For example, a MOS or a BJT element can be described using a single parameter buildcode. However, in certain instances it is desirable to use more than one buildcode to simplify the buildcode syntax. In one example, a MOS element is described using two or more buildcodes, such as a first buildcode which specifies an internal arrangement of device connections, such as to sources, drains, gates, emitters, bases, collectors, cathodes, anodes, plus and minus terminals and body ties, and a second buildcode which specifies guardband or isolation layout options, as well as a number or location of well ties, substrates ties or tub ties.

The buildcode representations can include coding for customizing at least one semiconductor device connection. The semiconductor device connections can specify custom layout information for sources, drains, gates, emitters, bases, collectors, cathodes, anodes, plus and minus terminals, body ties, well ties, substrates ties or tub ties.

Figure 1B:
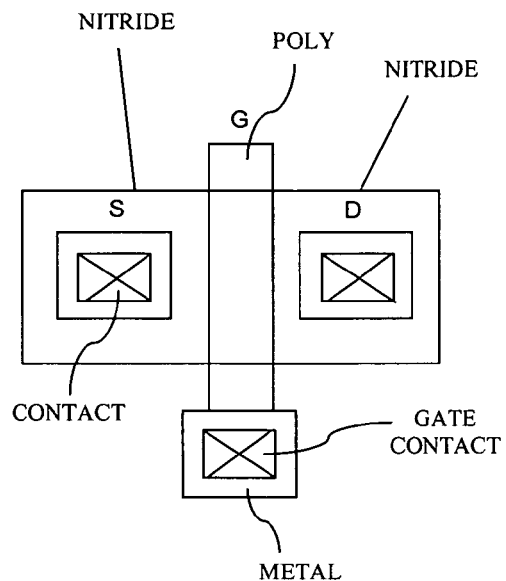
Figure 1C:
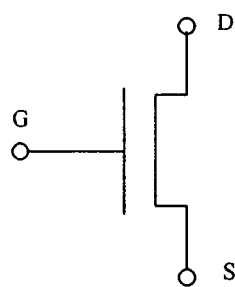
Figures 2A, 2B:
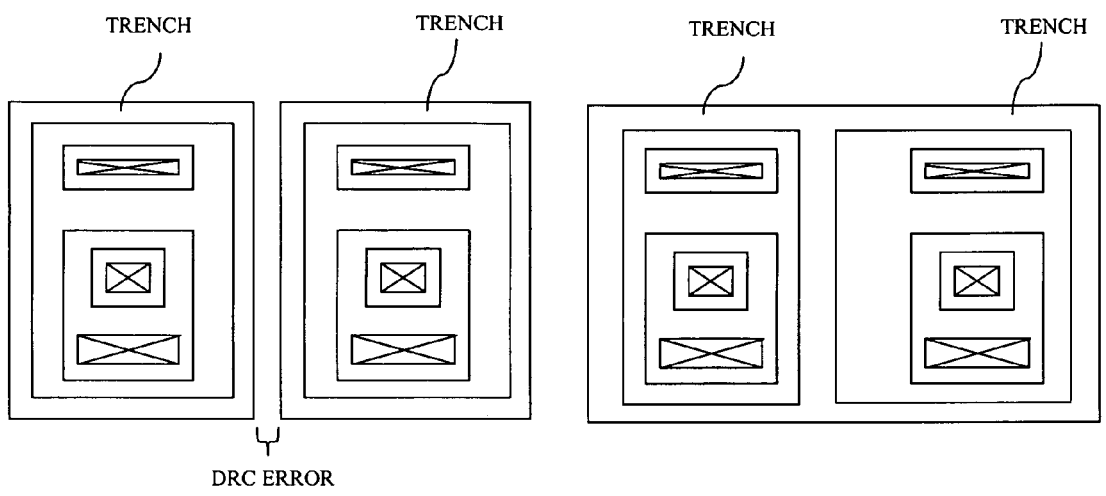

An exemplary buildcode that can be used to build MOS p-cells, is provided below:
S=source SI=source w/integrated body tie
D=drain SN=source w/non-integrated body tie
G=gate DN=drain w/non-integrated body tie
G or GN=gate w/no contact
GU=gate w/upper contact
GL=gate w/lower contact
G2=gate w/upper and lower contact Using the above code, the buildcodes for the MOS devices shown in FIGS. 1(a) and (b) can be given as follows:
FIG. 1(a) SGD (as noted above; G=gate w/ no contact)
FIG. 1(b) SGLD (as noted above GL=gate lower contact)

For multiple stripe or finger MOS devices, the buildcode can be used to provide simple customizations without adding parameters. For example, a common need in MOS devices is the provision for a body tie. Often, body ties are not needed in or near every source connection, the proximity and number of body ties being specified through the ground rules for the semiconductor process used to fabricate the given integrated circuit. Conventional p-cell based software generally provides a single parameter that adds a body tie into every source region of a MOS device, even when the process ground rules specify the need for fewer body ties. The location and number of body ties is highly dependent on the actual MOS layout and because the extra body ties take up valuable integrated circuit real-estate, the mask layout process usually involves editing of p-cells in order to optimize the number and location of the body ties. This optimization can be a lengthy time-consuming process that can delay the time-to-market of a given integrated circuit. Because of the highly competitive nature of the semiconductor business, there is a constant need to reduce the layout time for integrated circuits. Using the present invention, buildcodes can provide flexibility to easily customize the MOS body tie locations. For this example, such an exemplary buildcode may be "SIGDGSGDGSIGD", the "I" in the buildcode indicating that only the first and third source regions have body ties.

Figures 3A, 3B:
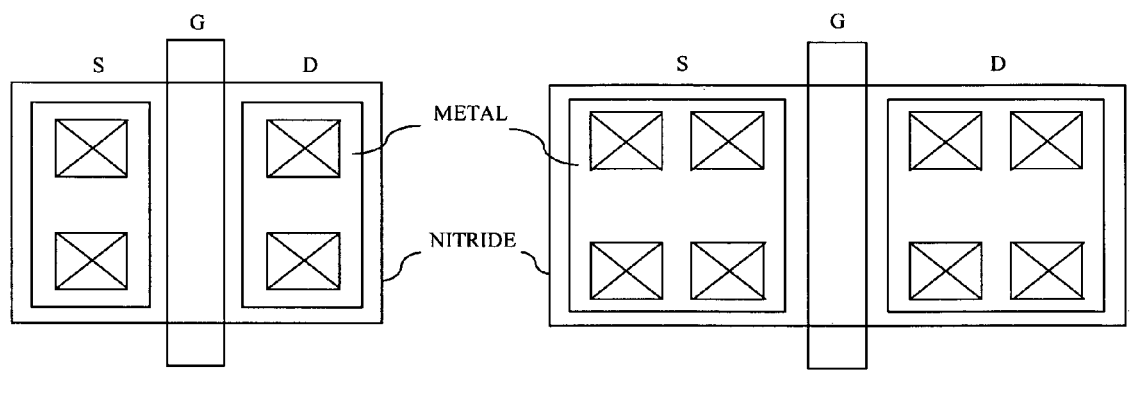

Buildcodes according to the invention can provide a wide variety of other layout customizations. For example, buildcodes can add a multiplier for the source or drain contact width. FIG. 3(a) shows a MOS layout having a double source/drain contact in a standard width source and drain, while FIG. 3(b) shows a MOS layout having a double source/drain contact disposed in a source and drain having a double width. To implement the double source and drain contact width device shown in FIG. 3(b), the buildcode S2GD2 can be used. Because a MOS p-cell is generally used for the smallest as well as the largest MOS elements in a circuit, there is sometimes a need to provide more contact area in large devices to satisfy metal electromigration concerns. For conventional p-cell based software, this flexibility may not exist, or if it does exist, once again applies equally to each of the drain and source regions of the MOS element. With the present invention, because of the buildcode construct described herein, individual source and drain regions can be selectively widened to accommodate more contact and metal area to address electromigration needs. Such a MOS p-cell is thus better able to accommodate the topological metal contact needs of the smallest and largest MOS elements in a given integrated circuit.

A multiplier can also be used to simplify long buildcodes to result in a shorter character string. For example, there may be MOS elements in a circuit that require a large number of gate stripes or fingers. The buildcodes for such elements can become long and harder to edit than shorter buildcodes. For long buildcodes, a multiplier 'function' can be added to the buildcode construct to simplify the buildcode representation. The "M3" code shown below is used to indicate a p-cell subcircuit having three (3) SGDG "segments". A final 'S' is added after the multiple segments to complete the transistor:

M3(SGDG)S=SGDGSGDGSGDGS

Figure 4A:
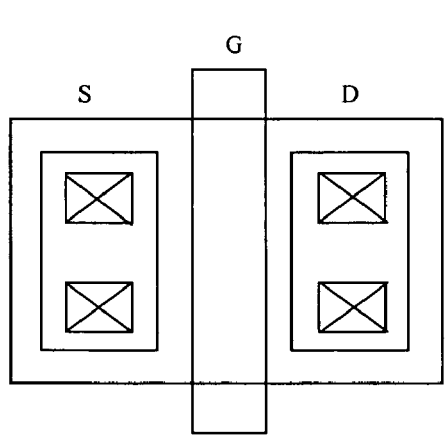
FIG. 4(a) shows a standard transistor layout. The layout shown in FIG. 4(b) which includes a 1.0 μm gate stretch both above and below the transistor is implemented using a single buildcode according to the invention.
Figure 4B:
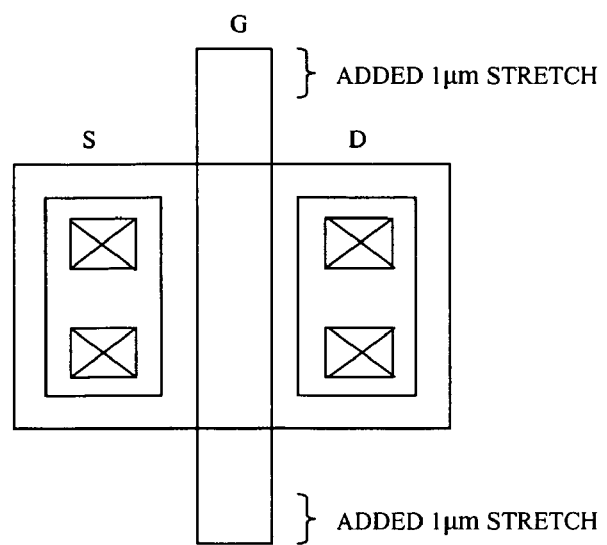

Fitting stretches can also be added using the invention. FIG. 4(a) shows a standard transistor layout. The layout shown in FIG. 4(b) includes a 1.0 μm gate stretch both above and below the transistor which can be implemented using the buildcode SG(U1.0 L1.0)D. The U1.0 corresponds to the magnitude of the stretch, being in this case 1 μm of stretch, with "U" corresponding to the 'Upper' gate region, while L1.0 corresponds to length, a 1 um stretch, with "L" corresponding to the Lower gate region stretch.

The buildcode can also be modified in lieu of adding additional parameters. For example, Cadence software (DFII) supports a feature referred to as "Auto Abutment". This feature allows two separate p-cells to automatically combine elements (such as shared sources and/or drains) when the two elements are overlapped or abutted in the graphical interface used for circuit layout design (Virtuoso XL). In using such a feature, the p-cell needs to support parameters including drain, source stretch and drain/source contact visibility, in order to implement the auto abutment behavior. Accordingly, for a drain to source abutment, several stretch parameters are needed in the p-cell as well as several parameters to turn the drain/source contact visibility on and off. Each abutted source or drain region may need to be individually stretched to produce a minimum ground rule abutted combination of the two source or drain regions. At the same time, parameters that specify whether a source or drain contact is visible or drawn in the p-cell are needed because when two source or drain regions are abutted and combined, only one (or sometimes neither) of the two contacts is needed. Using the invention, buildcode modifications can be used to implement these parameters to realize auto abutment, thus reducing the overall number of parameters needed to implement auto abutment.

For example, this can be accomplished by adding a contact code (e.g. N, turns off the metal contact in a given region) and a stretch value into each of the respective buildcodes for the MOS elements. For two devices that abut and share a source or drain region, the following example buildcodes can be used before and after the abutment:

|  | Before abutment | After abutment |
| --- | --- | --- |
| MOS Device 1, shared source | SGD | SN(0.0)GD |
| MOS Device 2, shared drain | SGD | SGD |

The above example indicates that the buildcode for the MOS Device 1 is modified to accommodate the sharing of its source region with the drain region of MOS Device 2. During the abutment event, a "callback" program automatically modifies the buildcode to change the construction of the two MOS devices for abutment. Prior art techniques require separate parameters, including two stretch and two contact parameters for each MOS device. The present invention would in this example replace a total of eight parameters (4 for each MOS device 1 and MOS device 2) with simple modifications to the respective buildcodes of the MOS devices.

As described above, p-cell behavior is controlled by a single or only a few buildcodes, rather than the large number of parameters generally required to layout custom integrated circuits. Greater customization of p-cell behavior becomes possible when using a buildcode according to the invention. For example, gate contacts can be individually controlled for multi-gate MOS devices. A conventional p-cell would need to support a parameter for each additional gate. Accordingly, a conventional five (5) gate device would require five (5) parameters. Over a period of time, adding a plurality of parameters to p-cells can create backward compatibility issues with legacy art work. This can occur because when circuit designs are modified at a later date, and may need to make use of later improvements to p-cells where old parameters are no longer used and new parameters have been added. This can also happen when circuit designs are migrated to other semiconductor processes. This is common practice for fabless semiconductor businesses, where circuits are produced at various foundry locations in order to minimize production cost. Each process used for a specific circuit can have elements that use different named or different valued parameters. It can be quite difficult to move circuit designs between different processes because of the mismatch in parameter names or values. When using p-cells based on buildcodes according to the invention, the buildcodes specifies the same behavior regardless of the semiconductor process. The process-specific information can be built into the p-cell code rather than the parameters, making migration between processes much easier. In a like manner, modifications to existing p-cells can be made by adding parameters or by modifying the buildcode. Adding parameters is less desirable because the new parameters are not present in older designs, requiring some data manipulation in order to bring an old design forward to use the new parameters. Adding new functionality to the buildcode can eliminate these backward compatible issues by eliminating the "overhead" of added new parameters that exists in the design software.

FIG. 5 is a flow chart showing steps in an exemplary method for layout of custom integrated circuits generated using at least one buildcode string, according to the invention. In step 510, a (conventional) preliminary integrated circuit layout is performed using a plurality of stored standardized programmed cells (p-cells). In step 520, a plurality of representations each comprising at least one variable are assigned. The representations each represent a circuit components or features thereof The representations have associated instructions for building or customizing a portion of the p-cells. In step 530, more than one of the plurality of representations are selected to form a buildcode string in step 540, a final layout of the custom integrated circuit is generated using at least one buildcode string.

In view of the above description, it should be clear that the invention can benefit all software used to do mask layout for integrated circuits. Thus, the invention allows highly facilitated customization of the mask layout views or programmed cells used during integrated circuit layout because p-cells can be quickly and easily modified or customized using buildcodes according to the invention. This represents a productivity enhancement over currently available design software which requires a large number of parameters for modification or customization.

Following assignment of buildcode representations for each of a plurality of circuit components and features thereof to realize the plurality of p-cells, and the generation of a final circuit layout of the custom integrated circuit using the buildcode representations, tape-out or stream out to a data file format usable by the mask making vendor then generally occurs. The masks received from the mask vendor are then used during the integrated circuit manufacturing process to fabricate the actual integrated circuit.

It is to be understood that while the invention has been described in conjunction with the preferred specific embodiments thereof, that the foregoing description is intended to illustrate and not limit the scope of the invention. Other aspects, advantages and modifications within the scope of the invention will be apparent to those skilled in the art to which the invention pertains.

I claim:

1. A method for laying out custom integrated circuits, comprising the steps of:
   preliminarily laying out a custom integrated circuit using a plurality of stored standardized programmed cells (p-cells);
   assigning a plurality of representations each comprising at least one variable, said representations each representing a circuit component or features thereof, said representations each having associated instructions for building or customizing a portion of said plurality of p-cells,
   selecting more than one of said plurality of said representations to form a buildcode string, and
   generating a final layout of said custom integrated circuit using at least one of said buildcode string.

2. The method of claim 1, wherein said buildcode string comprises an alpha-numeric string.

3. The method of claim 1, wherein said plurality of representations include at least one representation for customizing at least one semiconductor device connection.

4. The method of claim 3, wherein said semiconductor device connection specifies layout information for at least one selected from the group consisting of sources, drains, gates, emitters, bases, collectors, anodes, plus and minus terminals, body ties, well ties, substrates ties and tub ties.

5. The method of claim 1, wherein said plurality of representations include at least one representation for a fitting parameter.

6. The method of claim 1, wherein said plurality of representations include at least one representation which adds a multiplier for at least one geometrical feature.

7. The method of claim 6, wherein said geometrical feature comprises contact width.

8. The method of claim 6, wherein said geometrical feature comprises a number of gate contacts.

9. The method of claim 1, wherein a semiconductor device in said custom integrated circuit is described using at least a first and a second of said buildcode strings.

10. The method of claim 9, wherein said first buildcode string specifies an internal arrangement of device connections selected from the group consisting of sources, drains, gates, emitters, bases, collectors, cathodes, anodes, plus and minus terminals and body ties, and said second buildcode string specifies at least one selected from the group consisting of guardband, isolation layout options, and a number or location of well ties, substrates ties or tub ties.

11. The method of claim 1, wherein said buildcode string includes a multiplier to represent repeating strings otherwise appearing in said buildcode string to reduce a number of characters.

12. The method of claim 1, wherein said buildcode string includes a multiplier to represent repeating strings otherwise appearing in said buildcode string to reduce a number of variables in said buildcode string.

13. The method of claim 1, wherein said buildcode string includes one of said representations to support sharing of at least one device region between neighboring devices.

14. The method of claim 13, further comprising the step of fabricating a plurality of mask sets based on said final layout.

15. The method of claim 14, further comprising the step fabricating said custom integrated circuit using said plurality of mask sets.

16. A machine readable storage having stored thereon a computer program having a plurality of code sections executable by a machine for causing the machine to perform the step of:
   providing preliminarily layout based on a plurality of stored standardized programmed cells (p-cells); and
   generating a final layout for a custom integrated circuit by processing at least one buildcode string, said buildcode string comprising a plurality of representations wherein each of said representations comprise at least one variable, said representations each representing a circuit component or features thereof, said representations having associated instructions for building or customizing a portion of said plurality of p-cells.

17. The machine readable storage of claim 16, wherein said buildcode string comprises an alpha-numeric string.

18. A method of laying out custom integrated circuits, the method comprising:
   preliminarily laying out a custom integrated circuit using a plurality of stored standardized programmed cells (p-cells);
   assigning a plurality of representations, each of said representations configured to provide instructions for building or customizing at least one of said plurality of p-cells;
   associating at least one buildcode string with one or more of the plurality of p-cells, each of the at least one buildcode strings comprised of one or more of said representations; and
   generating a final layout of said custom integrated circuit using the instructions provided by the one or more representations of the at least one buildcode string.

19. The method of claim 18, wherein said buildcode string comprises an alpha-numeric string.

20. The method of claim 18, wherein said plurality of representations include at least one representation for customizing at least one semiconductor device connection.

* * * * *